United States Patent
Wyland

(10) Patent No.: US 12,027,465 B2
(45) Date of Patent: Jul. 2, 2024

(54) IMPEDANCE CONTROLLED ELECTRICAL INTERCONNECTION EMPLOYING META-MATERIALS

(71) Applicant: Taiwan Semiconductor Manufacturing Company, Ltd., Hsin-Chu (TW)

(72) Inventor: Christopher Wyland, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 88 days.

(21) Appl. No.: 17/952,838

(22) Filed: Sep. 26, 2022

(65) Prior Publication Data

US 2023/0020310 A1    Jan. 19, 2023

Related U.S. Application Data

(60) Continuation of application No. 16/685,623, filed on Nov. 15, 2019, now Pat. No. 11,456,255, which is a
(Continued)

(51) Int. Cl.
*H01L 23/538* (2006.01)
*H01L 23/00* (2006.01)
(Continued)

(52) U.S. Cl.
CPC ...... *H01L 23/5383* (2013.01); *H01L 23/5226* (2013.01); *H01L 23/5387* (2013.01);
(Continued)

(58) Field of Classification Search
CPC .................................. H01L 23/00; H01P 1/04
See application file for complete search history.

(56) References Cited

U.S. PATENT DOCUMENTS

| 4,686,492 A | 8/1987 | Grellmann et al. |
| 6,867,668 B1 | 3/2005 | Dagostino et al. |
(Continued)

FOREIGN PATENT DOCUMENTS

| EP | 0 563 969 A2 | 4/1993 |
| EP | 1 376 745 A1 | 6/2003 |
(Continued)

OTHER PUBLICATIONS

European Patent Office, PCT International Search Report mailed Jun. 5, 2009 for Application No. PCT/I82008/053390, 3 pages.

*Primary Examiner* — Marvin Payen
(74) *Attorney, Agent, or Firm* — Haynes and Boone, LLP

(57) ABSTRACT

A method of improving electrical interconnections between two electrical elements is made available by providing a meta-material overlay in conjunction with the electrical interconnection. The meta-material overlay is designed to make the electrical signal propagating via the electrical interconnection to act as though the permittivity and permeability of the dielectric medium within which the electrical interconnection is formed are different than the real component permittivity and permeability of the dielectric medium surrounding the electrical interconnection. In some instances the permittivity and permeability resulting from the meta-material cause the signal to propagate as if the permittivity and permeability have negative values. Accordingly the method provides for electrical interconnections possessing enhanced control and stability of impedance, reduced noise, and reduced loss. Alternative embodiments of the meta-material overlay provide, the enhancements for conventional discrete wire bonds whilst also facilitating single integrated designs compatible with tape implementation.

20 Claims, 14 Drawing Sheets

Related U.S. Application Data division of application No. 14/685,432, filed on Apr. 13, 2015, now Pat. No. 10,483,209, which is a continuation of application No. 13/060,173, filed as application No. PCT/IB2008/053390 on Aug. 22, 2008, now Pat. No. 9,006,098.

(51) Int. Cl.
  *H01L 23/522*  (2006.01)
  *H01L 23/66*   (2006.01)
  *H01P 1/04*    (2006.01)
  *H05K 1/02*    (2006.01)

(52) U.S. Cl.
  CPC .............. *H01L 23/66* (2013.01); *H01L 24/48* (2013.01); *H01L 24/49* (2013.01); *H01L 24/50* (2013.01); *H01L 24/86* (2013.01); *H01L 24/91* (2013.01); *H01P 1/047* (2013.01); *H05K 1/0243* (2013.01); *H01L 24/45* (2013.01); *H01L 2223/6611* (2013.01); *H01L 2223/6627* (2013.01); *H01L 2224/45014* (2013.01); *H01L 2224/45015* (2013.01); *H01L 2224/45124* (2013.01); *H01L 2224/45144* (2013.01); *H01L 2224/45147* (2013.01); *H01L 2224/4805* (2013.01); *H01L 2224/48091* (2013.01); *H01L 2224/48135* (2013.01); *H01L 2224/48472* (2013.01); *H01L 2224/48599* (2013.01); *H01L 2224/48699* (2013.01); *H01L 2224/49052* (2013.01); *H01L 2224/49111* (2013.01); *H01L 2224/49174* (2013.01); *H01L 2224/49175* (2013.01); *H01L 2224/73265* (2013.01); *H01L 2224/85207* (2013.01); *H01L 2924/00014* (2013.01); *H01L 2924/01005* (2013.01); *H01L 2924/01006* (2013.01); *H01L 2924/01013* (2013.01); *H01L 2924/01014* (2013.01); *H01L 2924/01015* (2013.01); *H01L 2924/01027* (2013.01); *H01L 2924/01029* (2013.01); *H01L 2924/01033* (2013.01); *H01L 2924/01075* (2013.01); *H01L 2924/01079* (2013.01); *H01L 2924/01082* (2013.01); *H01L 2924/014* (2013.01); *H01L 2924/10329* (2013.01); *H01L 2924/14* (2013.01); *H01L 2924/1903* (2013.01); *H01L 2924/19032* (2013.01); *H01L 2924/20751* (2013.01); *H01L 2924/20752* (2013.01); *H01L 2924/20753* (2013.01); *H01L 2924/20754* (2013.01); *H01L 2924/20755* (2013.01); *H01L 2924/30105* (2013.01); *H01L 2924/30107* (2013.01); *H01L 2924/3011* (2013.01); *H01L 2924/30111* (2013.01); *H01L 2924/3025* (2013.01); *H05K 2203/049* (2013.01)

(56) References Cited

U.S. PATENT DOCUMENTS

| 7,217,997 B2   | 5/2007  | Wyland  |
| 2006/0180916 A1 | 8/2006  | Wyland  |
| 2008/0266028 A1 | 10/2008 | Wyland  |
| 2011/0193042 A1 | 8/2011  | Maxwell |

FOREIGN PATENT DOCUMENTS

| WO | WO2004/053987 | 6/2004 |
| WO | WO2007/069224 | 6/2007 |
| WO | WO2008/096283 | 8/2008 |

IMPEDANCE CONTROLLED ELECTRICAL INTERCONNECTION EMPLOYING META-MATERIALS

CROSS REFERENCE

This is a continuation application of U.S. patent application Ser. No. 16/685,623, filed Nov. 15, 2019, which is a divisional application of U.S. patent application Ser. No. 14/685,432, filed Apr. 13, 2015, now U.S. Pat. No. 10,483,209, which is a continuation application of U.S. patent application Ser. No. 13/060,173, filed Feb. 22, 2011, now U.S. Pat. No. 9,006,098, which is a United States national phase application of and claims priority to International Patent Application No. PCT/IB2008/053390, filed Aug. 22, 2008, the disclosure of each of which is incorporated herein by reference in its entirety.

FIELD OF THE INVENTION

The invention relates generally to electronic device fabrication and packaging and more particularly to the design of controlled impedance electrical bond wire interconnections.

BACKGROUND OF THE INVENTION

An integrated circuit typically includes a plastic or ceramic package that encapsulates an electronic circuit, or a plurality of electronic circuits, each of which are formed on a semiconductor substrate. Electrical interconnection between the electronic circuit(s) and the external connections of the package are typically provided by wire bonding, flip-chip soldering, or tape automated bonding (TAB). With increasing complexity and functionality of electronic circuits, such electrical interconnections are commonly required across the surface of the semiconductor die as well as at the periphery of the semiconductor die. Additionally, electrical interconnects between the electronic circuits in a multi-chip module (MCM), where a plurality of electronic circuits have been co-packaged, require electrical interconnections similarly implemented within the entire footprint of the package rather than the periphery.

Consider wire bonding, where such electrical interconnections to any portion of an integrated circuit are easily implemented and function well at low frequencies. Such bond wires can vary in shape (round or flat), width (typically 15 μm to 200 μm), and length (typically 100 μm to 1000 μm). These bond wires represent a high characteristic impedance transmission line segment to a signal propagating within them. However, these wire bonded electrical interconnections become more problematic as data rates and signal frequencies increase, due to inductance, capacitance and resistance parasitics together with variations introduced from the manufacturing processes and equipment. Such parasitics manifest as excessive or variable impedance for the bond wire as signal frequency increases. Such impedance mismatches result in propagating signals having significant attenuations, due to reflection from the controlled impedance environment of the package electrical traces or electrical circuit to the bond wire. Such reflected signals can also cause degraded performance within the electronic circuits and result in distorted signal waveforms and increased noise.

Typically, the prior art solution has been to control or reduce parasitic effects by designing the device to reduce bond wire lengths, thereby reducing the bond wire inductance. Where a bond wire connection is desirable at the device edge, short bond wire lengths are possible and have utility. However, there are device applications where a bond wire is required on the device interior. Surprisingly, despite the plethora of electronic circuits, packaging formats, semiconductor die technologies, operating requirements, and manufacturers worldwide, the prior solutions to addressing the problems of providing high performance electrical interconnections to the electronic circuit have been relatively limited, and suffer significant drawbacks in design of the electronic circuit and package or in their reproducibility and manufacturability, especially for devices with very high electrical interconnect counts. Today packages may range from single transistor packages, such as the 4-pin SOT available from NXP Semiconductors (Package Identity SOT343F), through to multiple chip packages (MCP) such as the 2,116-pin high density BGA available from Renesas Technology (Package Identity PRBG2116FA-A). Accordingly, controlled impedance may be required by one electrical interconnection or all electrical interconnections.

Equally, these requirements for controlled, reproducible electrical interconnections exist throughout the wide range of package formats, pin counts, and signal frequencies present within today's electronic circuits. Examples of such devices range from NXP Semiconductors BFG424F NPN wideband transistor operating with analog input and output ports up to 25 GHz in a 4-pin SOT package, to Analog Devices AD6534 Othello-G Single-chip Direct Conversion GSM/GPRS Transceiver packaged within a 32-lead Lead Frame Chip Scale Package in Very Low Quad format (LFCSP-VQ) with dual analog input ports operating at the standard cellular frequencies of 800 MHz/900 MHz/1800 MHz/1900 MHz and digital output ports providing 64 kb/s digital audio, through to an Intel® Pentium® 4 Extreme processor implemented in 0.13 μm silicon with core operating at 3.5 GHz and packaged in a 775-pin LAND package with 64-bit digital data busses operating at 1066 MHz.

The common solution to the bond wire problem is to reduce the size of the transition by using a flip chip concept or ball grid array (BGA) package, in which contacts of a semiconductor circuit are directly bonded to an adjacent circuit or substrate. Another known solution is filling the transition region with a high dielectric constant material, such as for example an epoxy containing a ceramic. Although these solutions work, they are not applicable in all cases. For example, these solutions are not efficient in the sense that the high frequency signals in the transition might involve only a few of the interconnections in the transition. Therefore, the existing solutions become costly and inefficient to implement when only a few transition interconnections require special treatment for high frequency parasitic effects, or the materials within the semiconductor circuit cannot withstand e temperatures from the solder ball reflow operations in the above flip-chip and BGA solutions.

Techniques to reduce or control parasitic effects in bond wire configurations have included providing a plurality of parallel layers of bond wires, for example Grellman et al [U.S. Pat. No. 4,686,492], such that the inductive reactance of the bond wire is compensated by the capacitive reactance of the parallel bond wires. However, such a technique requires that the bonding pads on each end of the bond wire be capable of supporting three, four or more wire bonds, resulting in very large bond pads and increased semiconductor die footprints and cost. Equally, providing such parallel layers over long distances, with semiconductor die footprints reaching 25 mm square or more, results in fragile interconnects that cannot withstand the environmental requirements of electronic packaging. Finally, a 2,116 pin package with a 4-layer bond wire configuration as depicted by Grellman et al requires 8,464 bond wires to be placed, and 16,928 individual bond landings of the wire bonding tool to the package and semiconductor die, resulting in reduced yields, increased manufacturing times, and increased cost.

An alternative presented by Kwark et al [U.S. Patent Application 2005/0,116,013] involves providing a second bond, using a wider flat bond (commonly referred to as ribbon bonding), beneath the main wire bond. The resulting electrical connection provides a microstrip structure. As with Grellman et al the approach suffers from requiring increased die footprint, typically in dimensionally sensitive areas for high speed interconnections; requires providing additional ground bond pads adjacent to every bonding pad featuring the microstrip structure; and doubles the number of mechanical bonding operations.

Each of the solutions taught by Kwark and Grellman solve the issue of controlling the impedance individually for each bond wire. In contrast, Wyland [U.S. Pat. No. 7,217,997] teaches to provide a wide electrical plane above the wire bonds, with a dielectric spacer between to prevent an electrical short circuit between the signal wire bond and the wide electrical plane. As taught by Wyland the impedance of a wire bond can be reduced from the approximately 125Ω of a discrete wire bond to a typical 50Ω of an analog signal input/output by providing the wide electrical plane approximately 32 μm from the bond wire. Advantageously the approach taught by Wyland provides a single feature, the wide electrical plane, allowing a plurality of wire bonds to be managed simultaneously.

However, Wyland teaches that the wide electrical plane above the wire bonds can reduce the impedance to 50Ω but not significantly lower, due to the already small gap of 32 μm resulting in both tight tolerances and substantial variations in impedance for small variations or deviations in this gap. Further, the provision of such impedance controlled structures is best suited to designs wherein the bond wires are connected solely to the periphery of the semiconductor circuit and bonded directly to the package electrical traces. It would also be evident that the structure does not allow the semiconductor circuit designer latitude to provide bond wires close together but of different impedance, such as may be required in providing multiple outputs of different impedance such as 50Ω and 75Ω or the interconnection of very low impedance electronic circuits, such as amplifier gain stages of a few ohms within an MCM in close proximity to a 50Ω output port.

Accordingly it would be beneficial to provide a method of providing controlled impedance for bond wires irrespective of their placement within the semiconductor die or package. It would be further beneficial if the method allowed the impedance of different bond wires to be individually established whilst allowing provisioning of a single additional element during manufacturing and assembly. Additional benefit may be further obtained if the additional element was capable of integration with an electrical signal interconnection to provide the bond wires as a single-piece part, in order to reduce the complexity of the packaging process of the semiconductor circuit, MCM, etc. Further, a method allowing the required structures to be pre-manufactured and including the effect of additional dielectric materials present within the finished device, such as encapsulants, would be advantageous.

SUMMARY OF THE INVENTION

In accordance with the invention there is provided a method of providing at least an electrical interconnection of a plurality of electrical interconnections to a first device, each electrical interconnection being characterized by at least an interconnection length. The method further comprising providing an overlay, the overlay comprising at least a first meta-material structure and being disposed approximately parallel to the at least an electrical interconnection of a plurality of electrical interconnections for at least a predetermined portion of the interconnection length.

In accordance with another embodiment of the invention there is provided a circuit comprising at least an electrical interconnection of a plurality of electrical interconnections to a first device, each electrical interconnection being characterized by at least an interconnection length. The circuit further comprising an overlay, the overlay comprising at least a first meta-material structure and being disposed approximately parallel to the at least an electrical interconnection of a plurality of electrical interconnections for at least a predetermined portion of the interconnection length.

In accordance with another embodiment of the invention there is provided a computer readable medium having stored therein data according to a predetermined computing device format, and upon execution of the data by a suitable computing device a method of electrically interconnecting a circuit is provided. The method comprising providing at least an electrical interconnection of a plurality of electrical interconnections to a first device, each electrical interconnection being characterized by at least an interconnection length; and providing an overlay, the overlay comprising at least a first meta-material structure and being disposed approximately parallel to the at least an electrical interconnection of a plurality of electrical interconnections for at least a predetermined portion of the interconnection length.

In accordance with another embodiment of the invention there is provided a computer readable medium having stored therein data according to a predetermined computing device format, and upon execution of the data by a suitable computing device a circuit for electrically interconnecting a circuit is provided. The circuit comprising at least an electrical interconnection of a plurality of electrical interconnections to a first device, each electrical interconnection being characterized by at least an interconnection length; and an overlay, the overlay comprising at least a first meta-material structure and being disposed approximately parallel to the at least an electrical interconnection of a plurality of electrical interconnections for at least a predetermined portion of the interconnection length.

BRIEF DESCRIPTION OF THE DRAWINGS

Exemplary embodiments of the invention will now be described in conjunction with the following drawings, in which.

DETAILED DESCRIPTION OF EMBODIMENTS OF THE INVENTION

Figure 1:
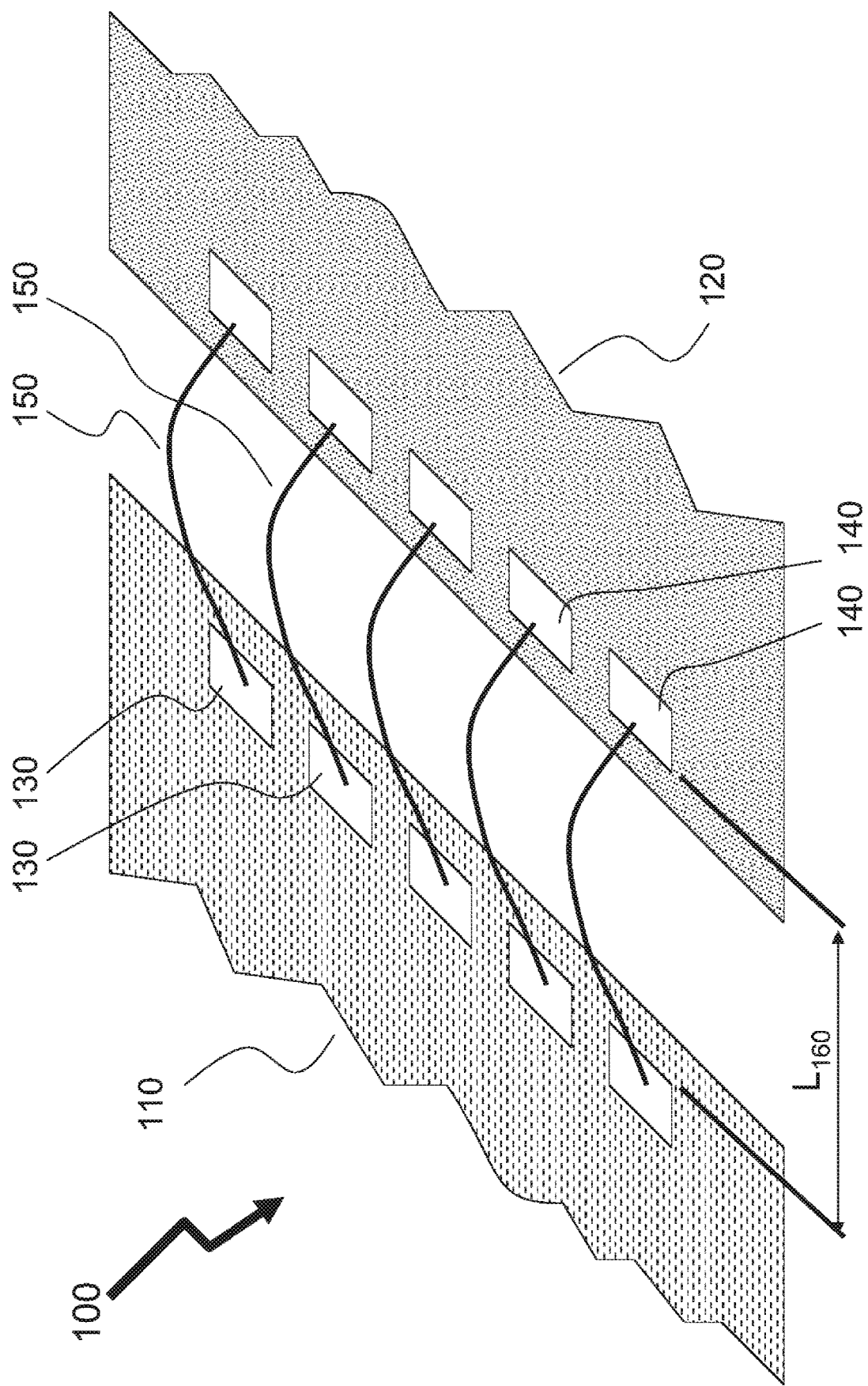
FIG. 1 illustrates a typical prior art electrical interconnection between two electronic elements using conventional wire bonds.

Illustrated in FIG. 1 is a typical prior art electrical interconnection 100 between two electronic elements 110 and 120 using conventional wire bonds 150. As shown, the first electronic element 110 has disposed upon its surface, close to its physical periphery, a plurality of first bond pads 130. Similarly, the second electronic element 120 has disposed upon its surface, close to its physical periphery, a plurality of second bond pads 140. Between each first bond pad 130 and second bond pad 140 a conventional wire bond 150 has been made. The wire bonds 150 typically are formed using thermosonic bonding, ball bonding or wedge bonding using gold, aluminum, or copper wire of diameter between 15 μm and 50 μm. The typical separation L160 between the first bond pads 130 and the second bond pads 140 is 100 μm to 250 μm.

Figure 2:
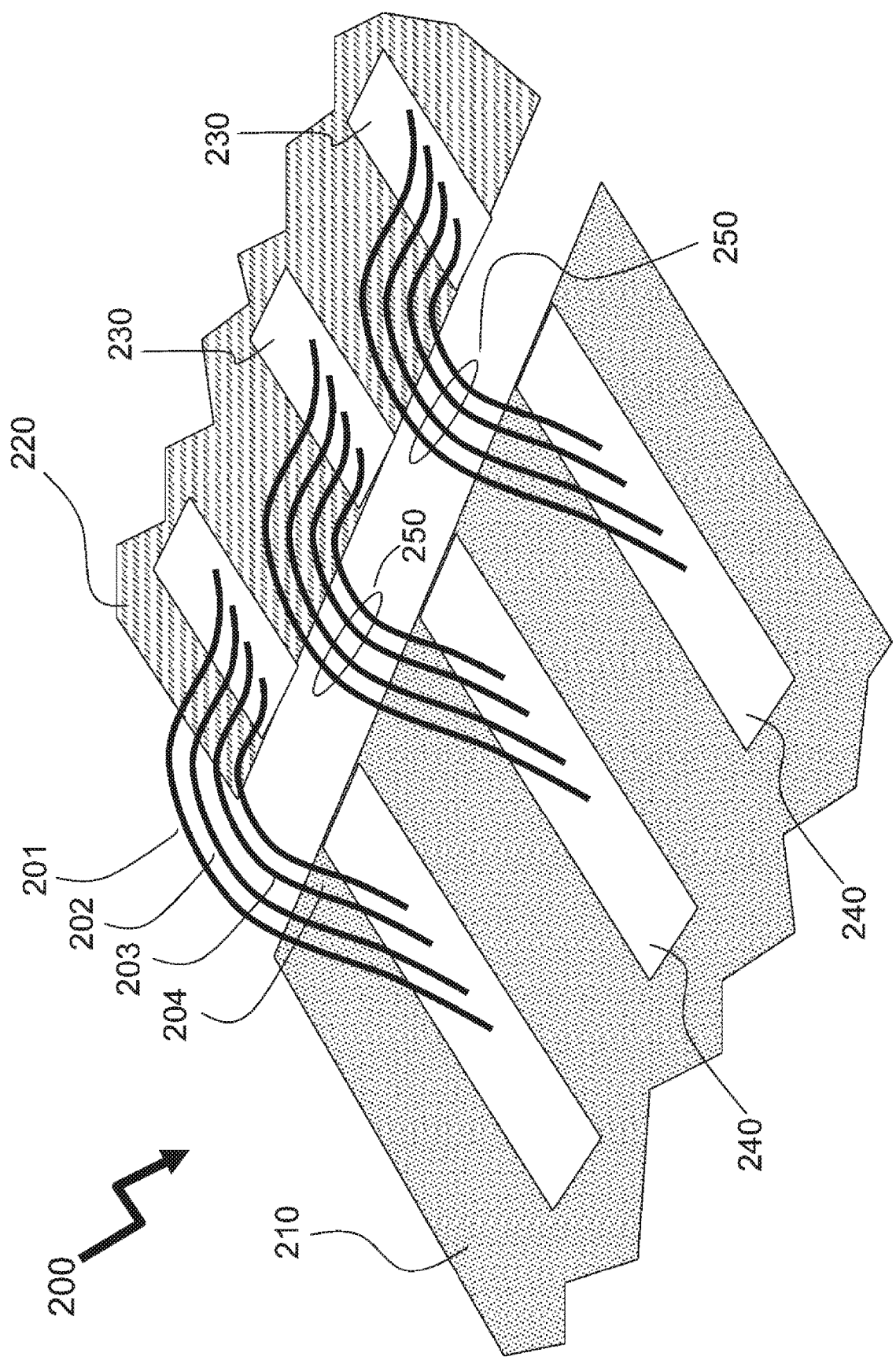
FIG. 2 illustrates the prior art layered wire bond approach to controlling impedance of the wire bonds according to Grellman et al.

A prior art layered wire bond approach to controlling impedance of the wire bonds according to Grellman et al is shown in layered interconnection 200 in FIG. 2. As shown a first device 210 having first bond pads 240 is electrically interconnected to second device 220 having second wire bonds 230. Each electrical interconnection being a parallel layered wire bond stack 250 from one first bond pad 240 to one second bond pad 230. The parallel layered wire bond stack 250 comprises a first bond 201, comparable to the wire bond 150 in FIG. 1, second bond 202, third bond 203, and fourth bond 204. Each of the second through fourth bonds 202 to 204 are respectively disposed such that the wire bonds are parallel to first bond 201 and spaced vertically above it. Each subsequent bond wire within the parallel layered wire bond stack 250 contribute a finite capacitance to compensate for the inductance of the first bond 201. As outlined supra the approach of Grellman et al increases the manufacturing complexity and cost of the electronic circuit containing the first and second devices 210 and 220, because of the multiple wire bonding operations required for each electrical interconnection and the increased footprint consumed with the multiple bond feet, especially with wedge bonding.

Figure 3:
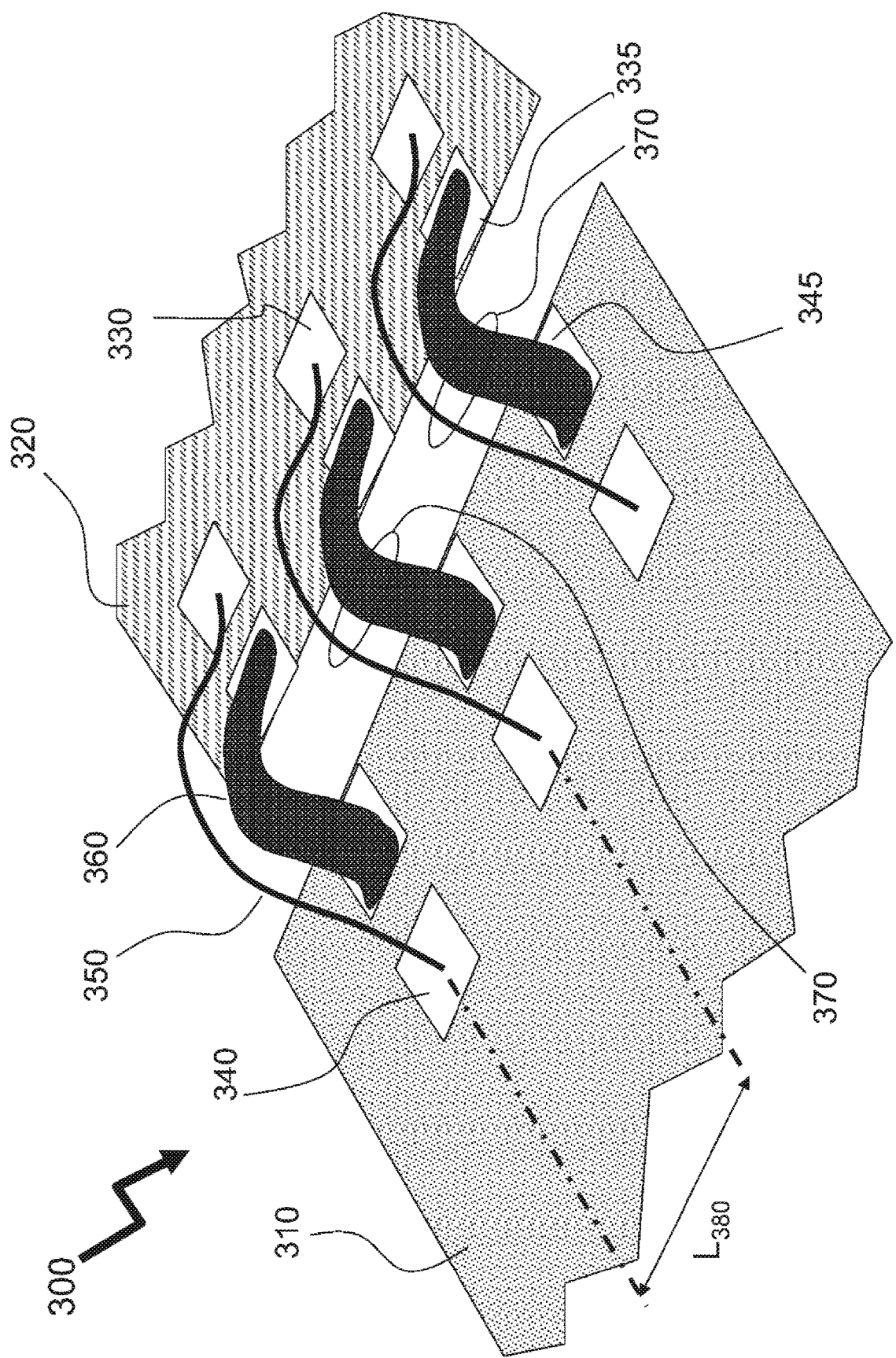
FIG. 3 illustrates the prior art approach of a co-dispensed ground plane to form a microstrip transition according to Kwark et al.

Now referring to FIG. 3, illustrated is the prior art approach of a co-dispensed ground plane interconnection 300 to form a microstrip transition 370 according to Kwark et al. Shown are a first device 310 with first bond pads 340 and first ribbon pads 345, in close proximity to a second device 320 having second bond pads 330 and second ribbon pads 335. Each microstrip transition comprising a wire bond 350 between first bond pad 340 and second bond pad 330 with a ribbon bond 360 between first ribbon pad 345 and second ribbon pad 335. Typical dimensions for ribbon used in forming the ribbon bond 360 are widths between 20 μm and 100 μm and thicknesses between 6 μm and 20 μm, although standard ribbons are available up to 1000 μm wide and 100 μm thick (see for example Bonding Ribbon manufactured by Kulicke and Soffa Industries, Fort Washington, Pennsylvania, USA). As with Grellman et al supra Kwark et al requires multiple bonds per required bond wire 350 and increased footprint to accommodate the wire bond pad and ribbon bond pad for each. The fact that the ribbon bond pads 335 and 345 are significantly wider than the bond pads 330 and 340 constitutes a limitation to the reduction of bond pad pitch L380. This limitation adds to the drawbacks of Kwark over Grellman for implementing controlled impedance bond wire interconnections.

The requirement for multiple bonds per bond wire of Kwark and Grellman presented above in respect of FIGS. 2 and 3 is ameliorated with a ground arch structure 400 according to Wyland. Shown is a base of a package 405, the remainder of which is not shown for clarity, upon which a semiconductor die 410 has been mounted, having disposed upon its surface device bond pads 420. Also disposed on the surface of the base 405 are package traces 440 and ground plane connections 450. In common with the other prior art approaches outlined supra the semiconductor die 420 is electrically interconnected to the package by wire bonds 430 between each device bond pad 420 and package trace 440.

However, now disposed over the wire bonds 430 is a ground arch 470 providing a capacitive correction for the inductive impedance of the wire bond 430. The ground arch 470 has disposed on its lower inner surface a dielectric 480, to prevent shorting of the ground arch 470 to the wire bond 430 in the event of deformation of the ground arch 470 or detachment of the wire bond 430. The ground arch 470 is electrically connected to the ground plane connection 450 by a conductive epoxy 460. As noted supra, to provide 50Ω impedance for the wire bond, as opposed to 120Ω without the ground arch 470, the separation L490 between the wire bond 430 and the ground arch 470, is 32 μm. As noted supra the ground arch 470 does not provide flexibility in implementing multiple bond wire impedances simultaneously, does not support multiple bond pad locations within the footprint of the semiconductor die 410 unless spaced consistently in a row at fixed distance from the periphery of the semiconductor die 410, and does not support very low impedances, which for example are required to interconnect multiple high frequency semiconductor devices such as low noise GaAs, InP or SiGe amplifiers within microwave MCMs.

Figure 5:
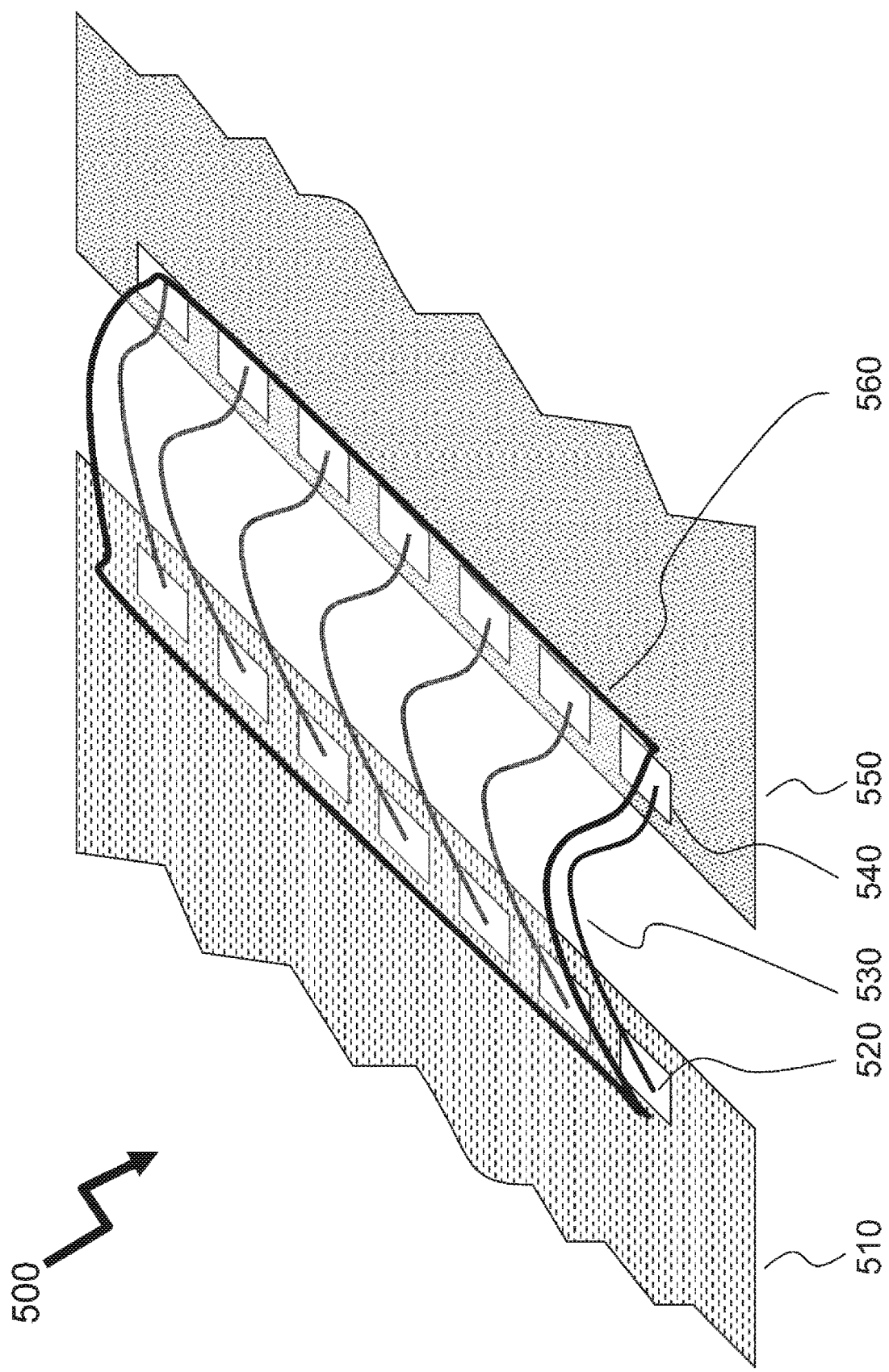
FIG. 5 illustrates an exemplary embodiment of the invention for providing a meta-material overlay to an array of wire bonds.

As such shown in FIG. 5 is an exemplary embodiment of the invention for providing a solution to the drawbacks and limitations of the prior art: a meta-material overlay 560 overlaying an array of wire bonds 530. Similarly to FIG. 1, a first device 510 is shown having a plurality of first bond pads 520, as well as a second device 550 with a plurality of second bond pads 540. Each of the first bond pads 520 is electrically connected to one of the second bond pads 540 via a wire bond 530. Overlaying the array of wire bonds 530 is the meta-material overlay 560 that provides the appropriate correction and control of the wire bond 530 environment such that the wire bond 530 impedance meets the desired target value. The meta-material overlay 560 is one of a plurality of materials that are designed to make the signal act in such a way as to make the shape of the signal behave as though the permittivity and permeability are different than the real component permittivity and permeability of the insulator used. It should be noted that the relative permittivity and relative permeability include both real and imaginary components, that is εR=εR+jεR and μR=μR+j μR. It is possible to design meta-materials so as to have the signal respond as if the permittivity and permeability have negative values. The meta-material within the exemplary embodiments, such as meta-material overlay 560, is an arrangement of conductors in the insulator that reduces the resonant response of the line on the signal. Optionally these meta-material designs are replaced with other meta-material designs.

Though current approaches to impedance matching rely on positive impedance, it is also possible to use negative impedances to perform impedance matching. A. F. Starr et al. write in their paper titled, "Fabrication and Characterization of a Negative-Refractive-Index Composite Meta-Material," Physical Review B 70, 113102 (2004) of the American Physical Society, "while there have not been many suggested paths toward the design of a material whose effective index-of-refraction is negative, a rigorous approach is to design a material whose electric permittivity (ε) and magnetic permeability (μ) are simultaneously negative. While there are no known naturally occurring materials or compounds that exhibit simultaneously negative ε and μ, such materials can be designed to provide effective ε and μ, as derived from effective medium arguments, which are singly or both negative over a finite frequency band."

Figure 4:
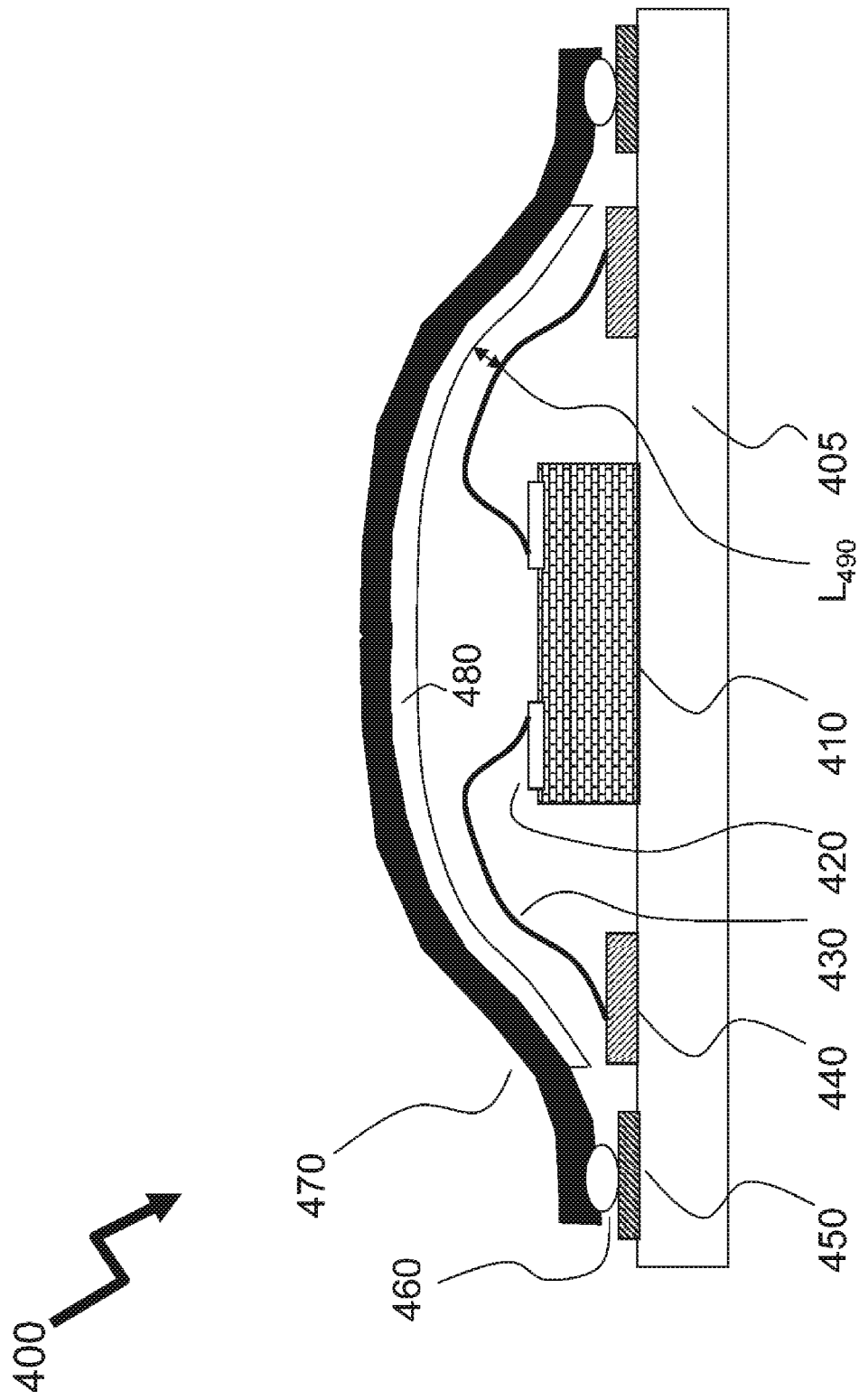
FIG. 4 illustrates the prior art approach of a ground arch according to Wyland.

Unlike Wyland, as presented supra in FIG. 4, in the meta-material overlay 560 the permittivity and permeability of the wire bond 530 is influenced in a negative direction, allowing the impedance of the wire bond 530 to be substantially lower than 50Ω if required, increasing the tolerances of spacing between the wire bond 530 and meta-material overlay 560 compared with the ground arch 470 of ground arch structure 400 and allowing for the meta-material overlay 560 to be employed wherever a wire bond 530 is required between first and second bond pads 520 and 540 irrespective of location within the semiconductor die or package.

Figure 6:
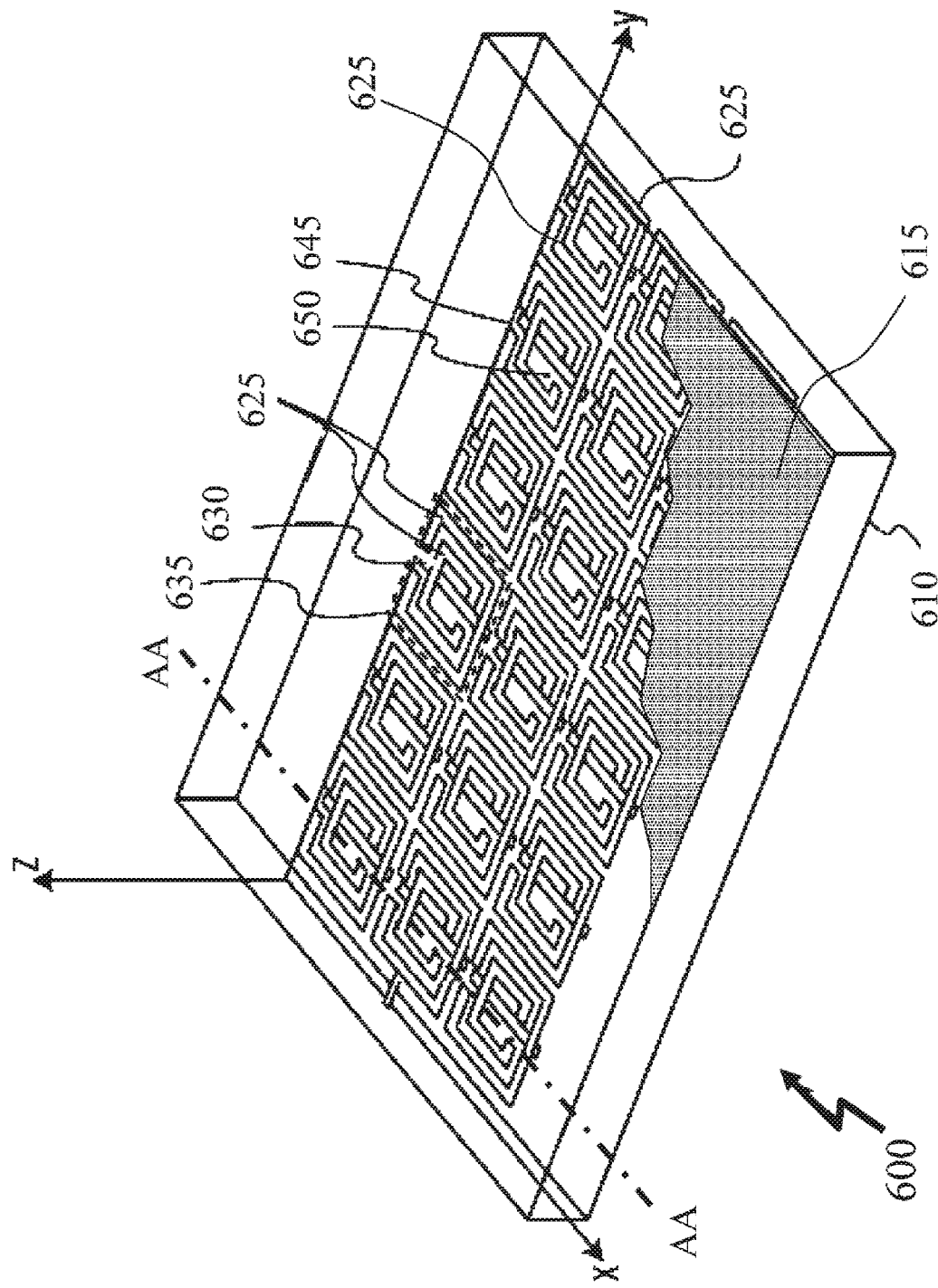
FIG. 6 illustrates an exemplary embodiment of the meta-material overlay structure according to FIG. 5.

Referring to FIG. 6 shown is a first exemplary meta-material structure 600 suitable for providing the meta-material overlay 560 of FIG. 5. A substrate 610 has been configured as a meta-material. As such within the substrate 610 is a pattern of conductive material 635 (i.e., a motif) arranged as concentric "square-circles" 625 that are hereinafter described as rectangular-like shapes. Such shapes include but are not limited to, rectangles and squares. Also within the substrate 610 is a pattern of straight sections of metal 630 and a meta-material conductor plane 615, shown on the surface of the substrate 610. According to an embodiment of the invention consider that the substrate 610, and therein meta-material conductor plane 615, are 14 mm long in the y-direction and that the meta-material is designed to enhance a signal transmission line, such as the wire bond 530 of FIG. 5, by controlling the impedance to reduce reflections, enhance power transfer and reduce signal noise.

The sum of the lengths of the rectangular-like shapes 635 is comparable to (and often may match) the length of the meta-material conductor plane 615. Optionally, this length of the meta-material conductor plane 615 is an integer division of the length of the wire bond 530 or a quarter fractional division thereof. The straight sections of metal 630 match the width of the rectangular-like shapes 635. In this embodiment the open rectangular-like shapes 635 are square in nature with a "diameter" of 2.5 mm; each element of the conductive material 635 being characterized by a conductor width of 0.1 mm and conductor thickness of 25 μm. Gaps 645 and 650 within the rectangular-like shapes 625 are 0.2 mm. The meta-material conductor plane 615 thickness is 25 μm. The metal in this meta-material structure 600 is typically gold, copper or aluminum but optionally is selected from a range of materials including other metals, metal alloys and conductive polymers. The insulator in this meta-material structure 600 is typically a high heat resistant thermosetting resin such as bismaleimide triazine (BT) resin, a resin employed in glass type copper clad laminates for circuit boards.

Figure 7A:
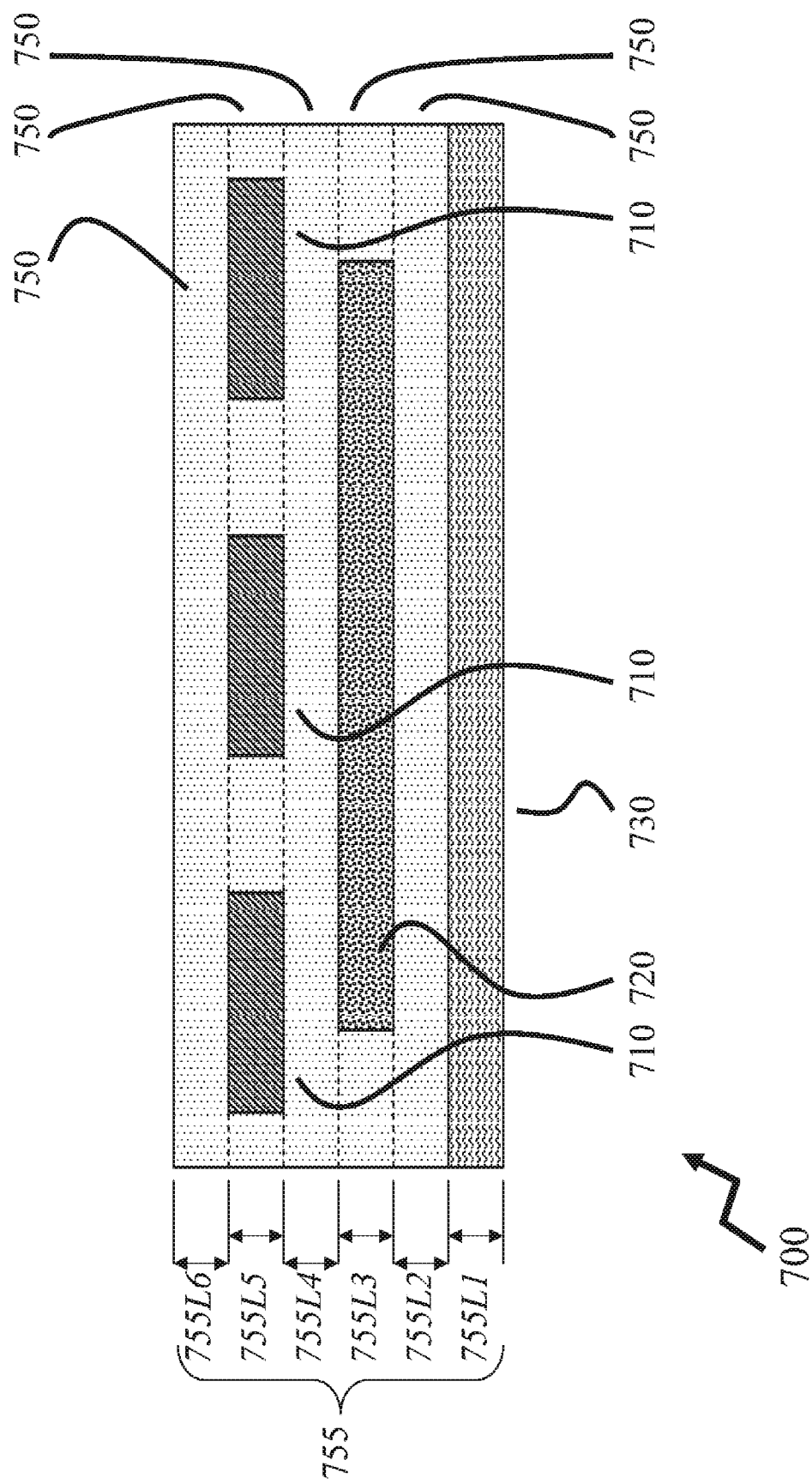
FIG. 7A illustrates an exemplary cross-section of the meta-material overlay according to FIGS. 5 and 6.

A cross-sectional view of a first exemplary meta-material substrate 700 is shown in FIG. 7A. The cross-sectional view being along the section AA-AA of meta-material substrate 600 of FIG. 6. The meta-material substrate 600 may be constructed as multiple layers 755. Layer 1 (755L1) is a ground plane 730, equivalent to the meta-material conductor plane 615 of FIG. 6 and is 25 μm thick. Upon the ground plane 730 is placed layer 2 (755L2); insulating material 750 of 100 μm thickness. Layer 3 (755L3) is where the straight sections of metal 720 are implemented within the meta-material substrate 700 and is also 25 μm thick. Layer 4 (755L4) is another 100 μm thick layer of insulating material 750. Layer 5 (755L5) includes an arrangement of metallic conductors 725 that form the concentric rectangular-like shapes 625 of FIG. 6 and have a thickness of 25 μm.

Upon layer 5 (755L5) there is a further layer 6 (755L6) of insulating material 750 of 100 μm thickness. Thus, for an exemplary embodiment the meta-material is implemented as the addition of two metallic layers 755L3 and 755L5 into the conventional ground plane 730 (755L1) and insulator material 750 of a copper tape.

Figure 7B:
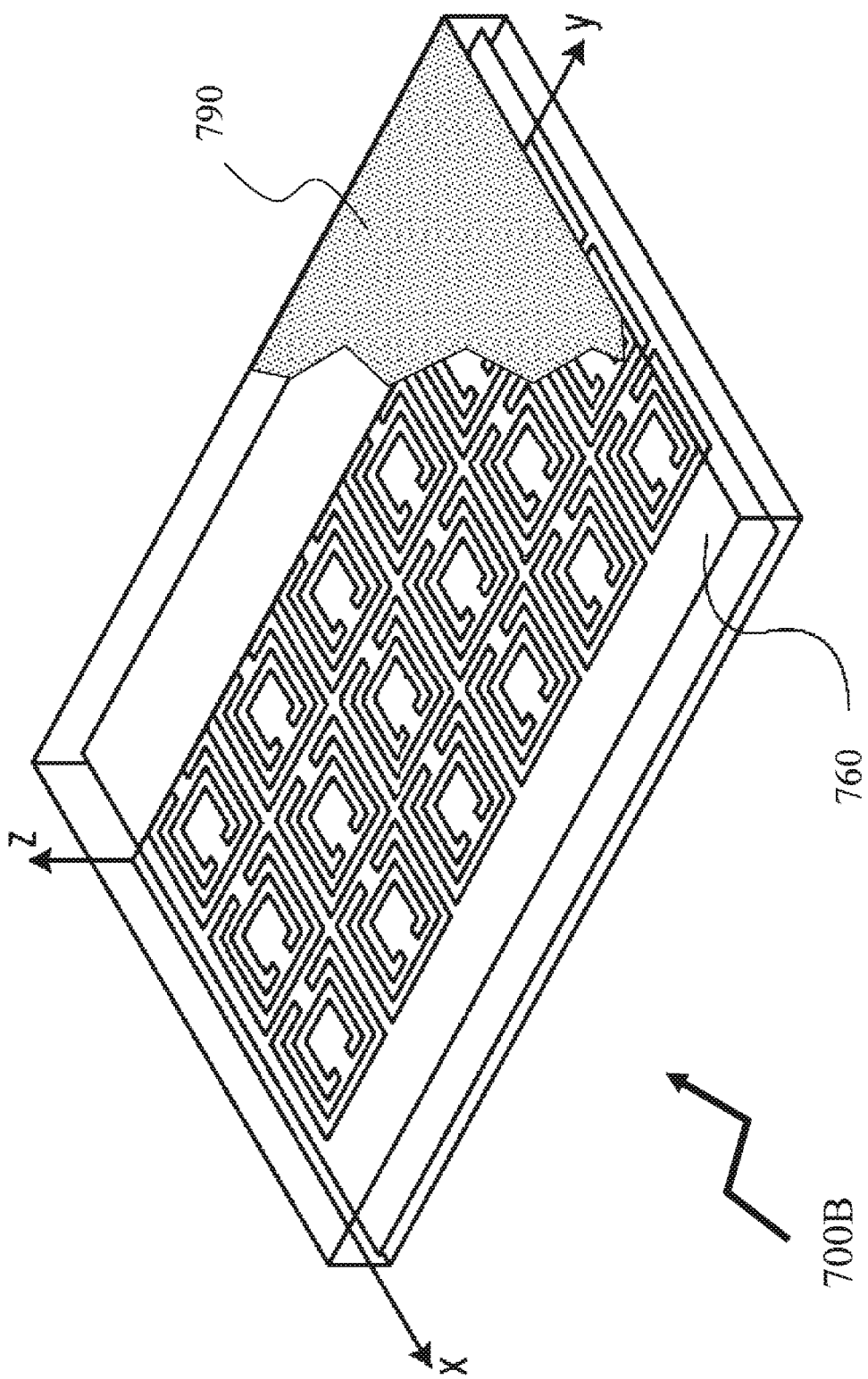
FIG. 7B illustrates another exemplary embodiment of the meta-material overlay.

Alternative embodiments with reduced or additional processing complexity are optionally implemented to provide the meta-material substrate 700. One such alternative embodiment is presented in FIG. 7B as meta-material substrate 700B, having a signal conductor plane 790 on an insulating material. At a predetermined distance below the signal conductor plane 790, an isolated metal structure 760 having concentric squares is defined. In contrast with the previous embodiment, the squares are regions with an absence of metal.

Figure 8:
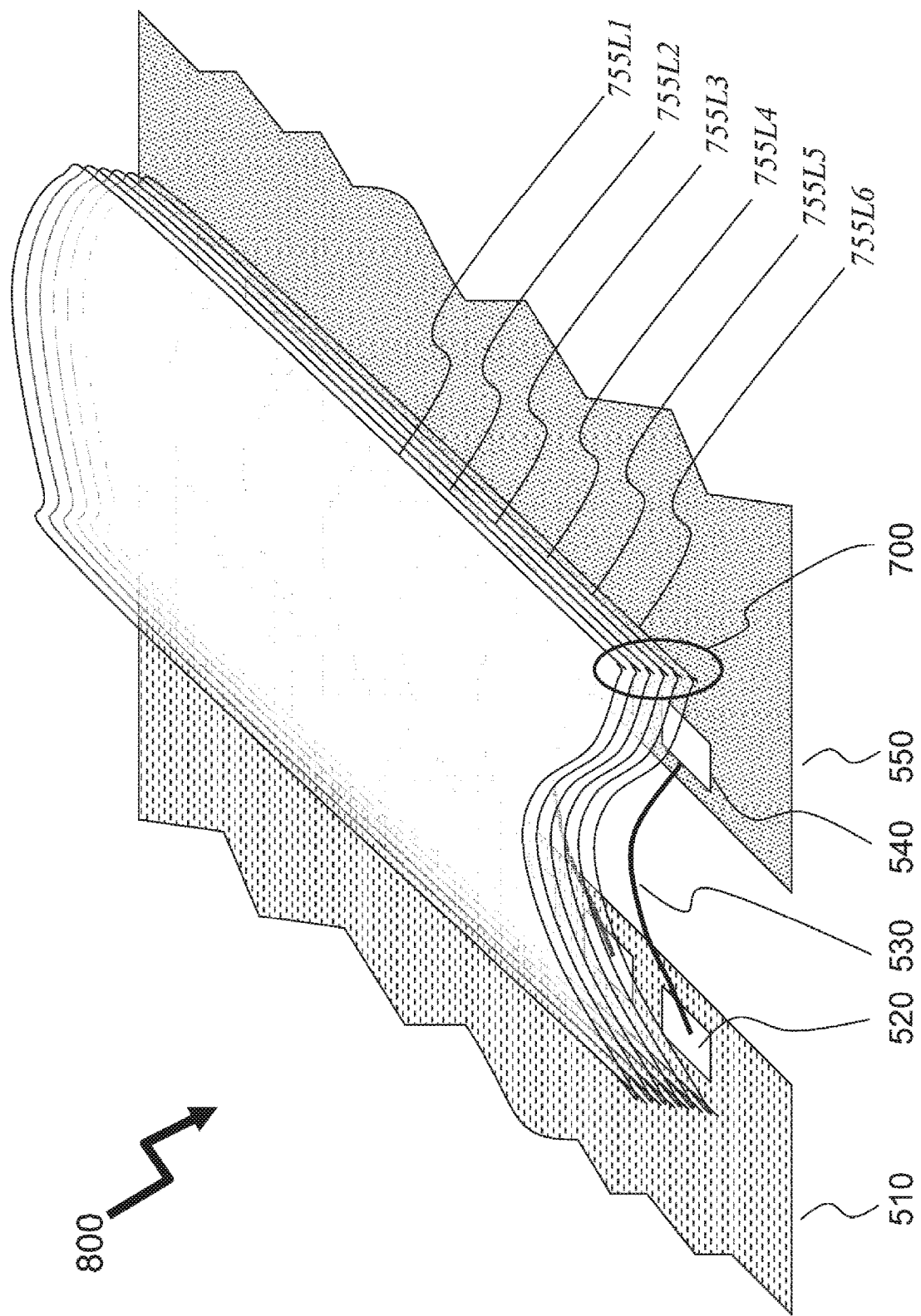
FIG. 8 illustrates an exemplary six layer meta-material overlay according to an embodiment the invention placed with respect to an array of wire bonds according to FIGS. 6 and 7.

FIG. 8 illustrates the exemplary six layer meta-material substrate 700 deployed according to an embodiment of the invention: as meta-material overlay placed with respect to an array of wire bonds according to FIG. 5. Hence, shown are a first device 510, having a plurality of first bond pads 520; as well as a second device 550 with a plurality of second bond pads 540. Each of the first bond pads 520 is electrically connected to one of the second bond pads 540 via the wire bond 530. In place of the meta-material overlay 560 there is placed the six layer meta-material substrate 700 comprising, in listed order: layer 755L6 of insulating material 750, layer 755L5 consisting of the arrangement of metallic conductors 725, layer 755L4 of insulating material 750, layer 755L3 including straight sections of metal 720, layer 755L2 of insulating material 750, and layer 755L1 being the ground plane 730.

Figure 9:
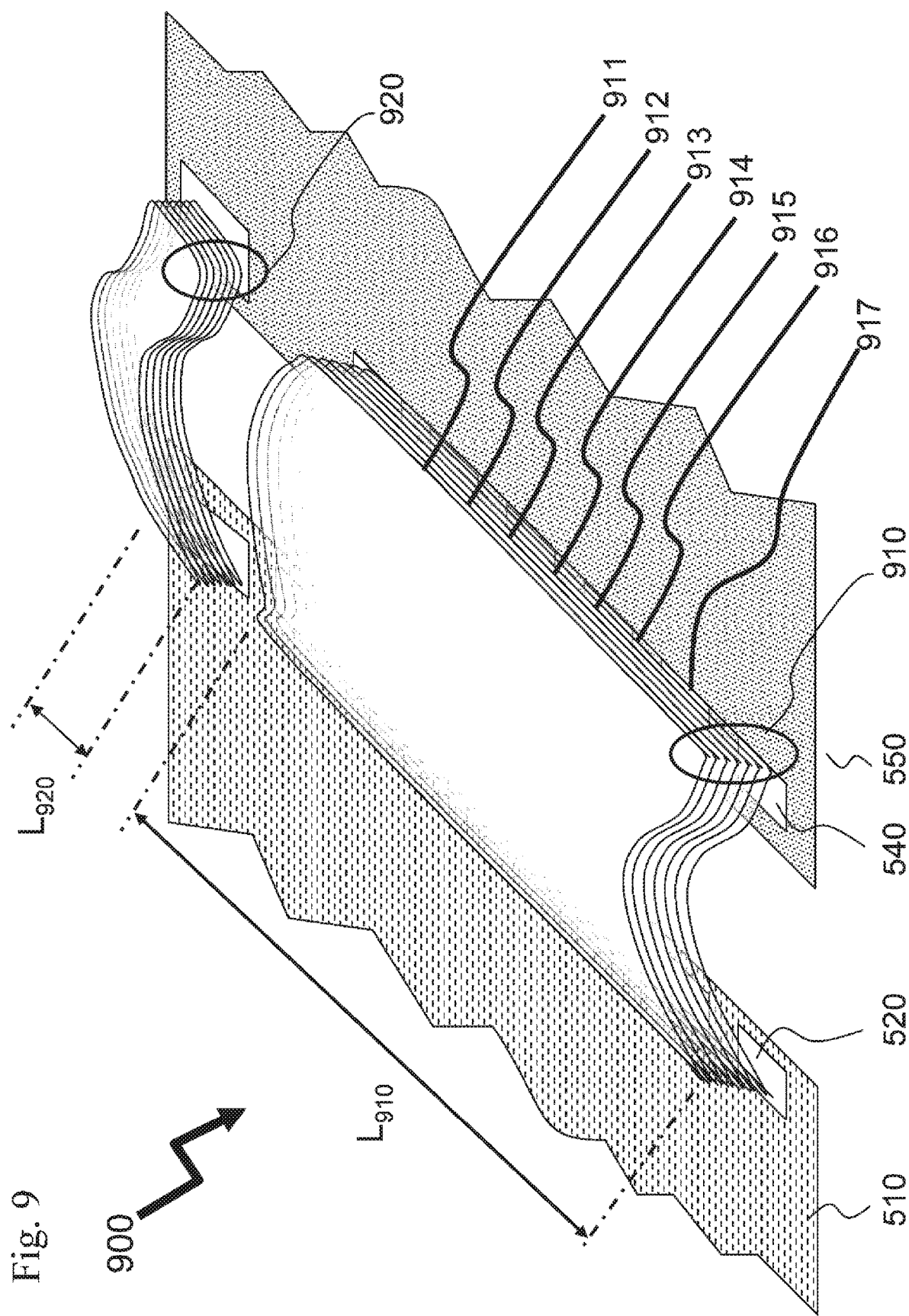
FIG. 9 illustrates an exemplary electrical interconnection using two seven layer meta-material overlays integrating both the six layer meta-material structure and wire bonds to provide a single interconnection element.

In the exemplary embodiments presented supra the meta-material overlay (such as meta-material overlay 700, 600 or 560) is separate from the wire bonds. Alternatively, the meta-material overlay may be implemented as a complete electrical interconnection. Such an arrangement is shown in FIG. 9 wherein seven layer meta-material overlays 910 and 920 provide controlled impedance electrical interconnection for arrayed interconnections. Accordingly, shown are a first device 510 with a plurality of first bond pads 520 and a second device 550 with a plurality of second bond pads 540. Interconnecting the array of first bond pads 520 and second bond pads 540 is the first seven-layer meta-material substrate 910, which consists initially of an electrical trace layer 917, wherein multiple electrical traces disposed within this layer replace the previous plurality of discrete wire bonds 530. The remaining layers of first seven-layer meta-material overlay 910 are: first insulating layer 916, metallic conductors 725 in first conductor layer 915, second insulating layer 914, straight sections of metal 720 in second conductor layer 913, third insulating layer 912, and signal conductor plane 911. First seven-layer meta-material substrate 910 has a length L910 sufficient to provide coverage of the plurality of first and second bond pads 520 and 540. respectively.

Also shown is second seven-layer meta-material 920, of length L920, which provides interconnection for a single electrical interconnection between a first bond pad 520 and a second bond pad 540. Optionally, the second seven-layer meta-material 920 has variations in the thickness, composition, and layout for the layers 911 through 916 with respect to the first seven-layer meta-material 910. This second design optionally: reduces material consumption by addressing only specific interconnections; provides specific bandwidth performance; or provides specific impedance characteristics, meta-material overlay shape characteristics or interconnection distance characteristics that are different from those of the first seven-layer meta-material 910.

Figure 10:
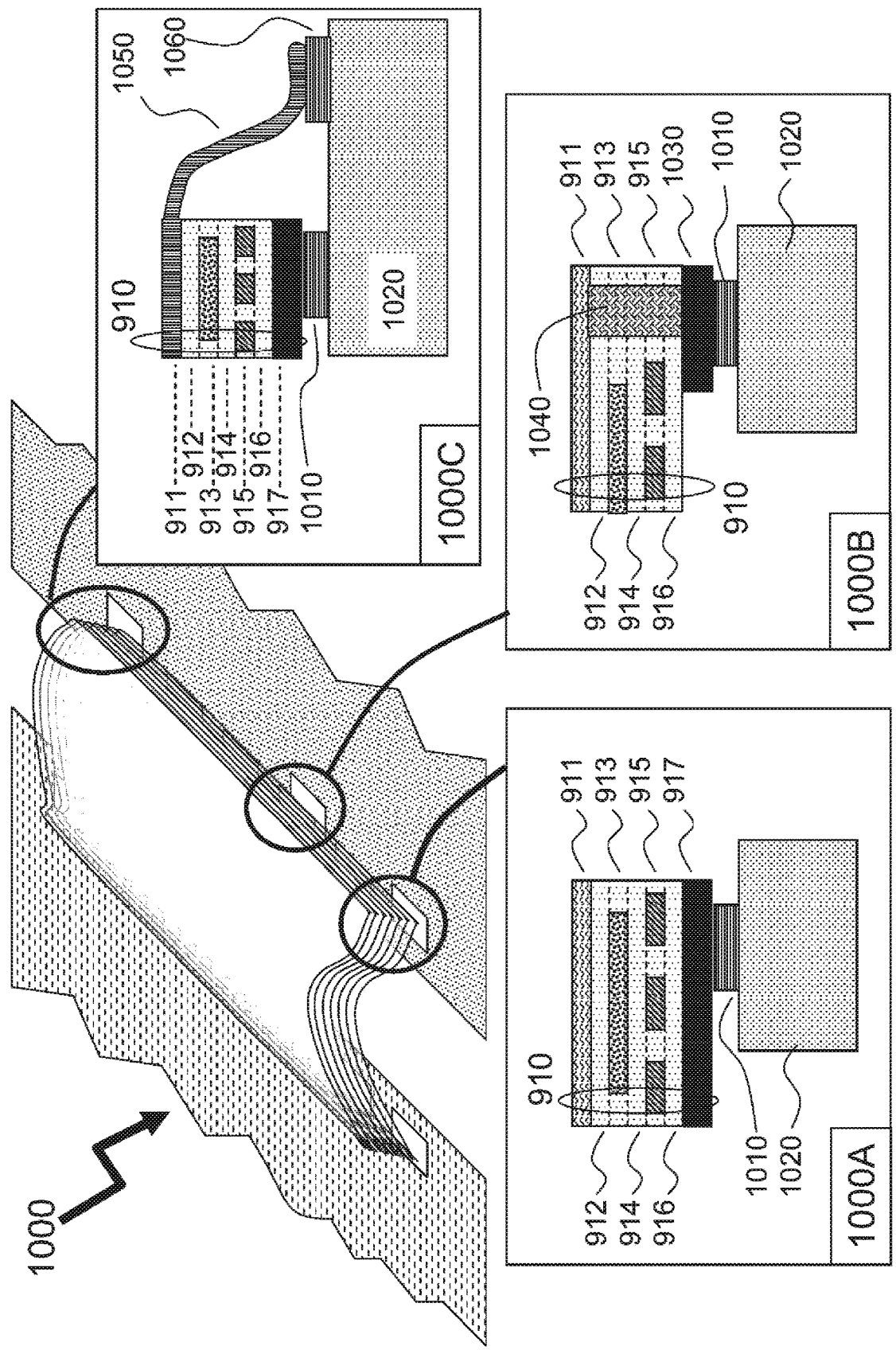
FIG. 10 illustrates exemplary electrical interconnections from the exemplary seven layer meta-material overlay of FIG. 9 to a semiconductor circuit or package.

The exemplary seven-layer meta-materials 910 and 920 require the attachment of electrical traces disposed within electrical trace layer 917 (the electrical traces replacing the discrete wire bonds 530) to the first and second bond pads 520 and 540 respectively. Similarly, the signal conductor plane 911 requires electrical interconnection to at least one of the two ground contacts provided within at least the first and second devices 510 and 550. Exemplary approaches to providing these electrical interconnections from the exemplary seven-layer meta-material overlay of FIG. 9 to a semiconductor circuit or package are shown in FIG. 10. The exemplary seven-layer meta-material interconnection 1000 is shown with respect to cross-sections 1000A through 1000C.

Referring to first cross-section 1000A the 7-layer meta-material overlay 910 is shown overlaid on a bond pad, either first bond pad 520 or second bond pad 540, comprising metallization 1010 on a substrate 1020. The electrical trace layer 917 is shown in contact with the metallization 1010, such contact being implemented by standard techniques including conductive adhesive and solder. Second cross-section 1000B shows a first electrical interconnection of the signal conductor plane 911 of the seven-layer meta-material overlay 910 to a metallization 1010 on substrate 1020. As shown, the direct connection from the metallization 1010 to the seven-layer meta-material overlay 910 is a via metallization 1030 which forms a discrete portion of the electrical trace layer 917. The via metallization 1030 is electrically connected to the signal conductor plane 911 through a via 1040 which routes through first insulating layer 916, first conductor layer 915, second insulating layer 914, second conductor layer 913, third insulating layer 912, and signal conductor plane 911.

The via metallization 1030 to metallization 1010 contact is implemented by standard techniques such as outlined supra. The formation of via 1040 as outlined is compatible with industry standard techniques for the fabrication of the seven-layer meta-material overlay 910 as a variant of tape used within tape automated bonding (TAB). An alternate embodiment of the seven-layer meta-material overlay 910 is shown with third cross-section 1000C, which removes the via metallization 1030, offering a simplified interconnection for the signal conductor plane 911. As shown, in this embodiment the seven-layer meta-material overlay 910 interconnects the electrical trace layer 917 to a bond pad 1010 on a substrate 1020 in a manner similar to that in the first cross-section 1000A. The signal conductor plane 911, rather than terminating proximate to bond pad 1010 as in the previous cross-sections, extends with a free region 1050 formed to interconnect with a signal plane bond pad 1060. This interconnection is made via standard techniques such as those providing interconnection of electrical trace layer 917 to bond pad 1010 outlined supra, but optionally includes thermo-compression wedge bonding or other variants of bonding.

Figure 11:
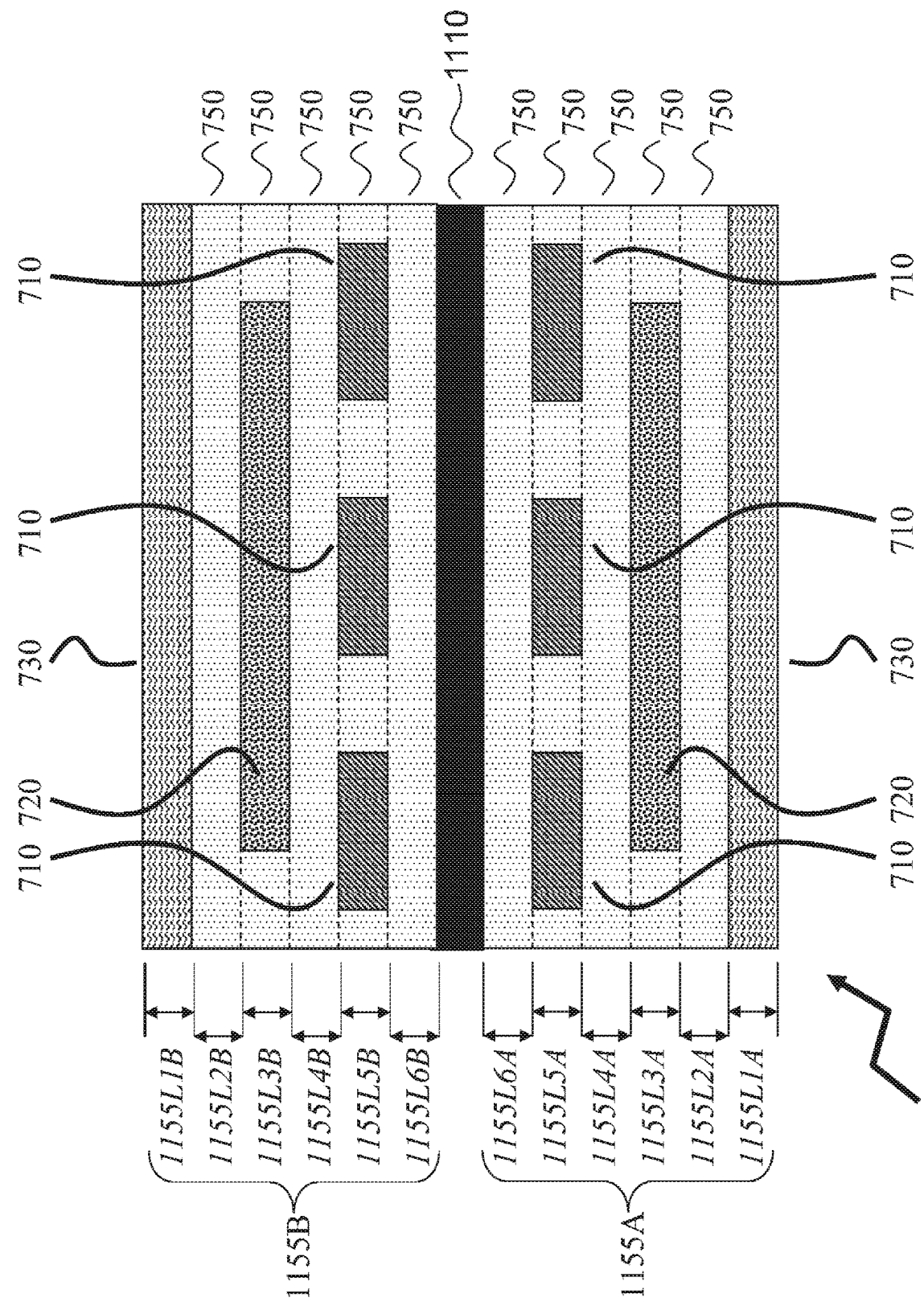
FIG. 11 illustrates an exemplary thirteen layer meta-material overlay according to an embodiment of the invention wherein electrical signal interconnections are sandwiched between two six layer meta-material structures.

The exemplary embodiments supra employ either six-layer or seven-layer meta-material, the latter incorporating the electrical trace layer into the layer arrangement and thereby removing the requirement for separate wire bonds. In some instances the electrical signals are sensitive to noise arising from coupling from electrical interconnections in proximity to the overlay, or the electrical interconnections over which the overlay lies are sensitive to noise coupled from the overlay electrical traces. Further, in some instances the tolerances for implementing an overlay or the absolute magnitude of the desired impedance reach a threshold where an alternative overlay implementation is appropriate. In these situations a 13-layer meta-material overlay 1100, such as shown in FIG. 11, provides either additional shielding of the electrical traces, design flexibility or relaxed tolerances.

As shown the 13-layer meta-material overlay 1100 comprises a lower six-layer meta-material structure 1155A, electrical trace layer 1110, and upper six-layer meta-material structures 1155B. The lower six-layer meta-material structure 1155A formed from first signal conductor plane 1155L1A, first insulating layer 1155L2A, straight sections of metal 720 in first conductor layer 1155L3A, second insulating layer 1155L4A, metallic conductors 725 in second conductor layer 1155L5A, and third insulating layer 1155L6A.

The upper six-layer meta-material structure 1155B is formed from second signal conductor plane 155L1B, fourth insulating layer 1155L2B, straight sections of metal 720 in third conductor layer 1155L3B, fifth insulating layer 1155L4B, metallic conductors 725 in fourth conductor layer 1155L5B, and sixth insulating layer 1155L6B.

Figure 12:
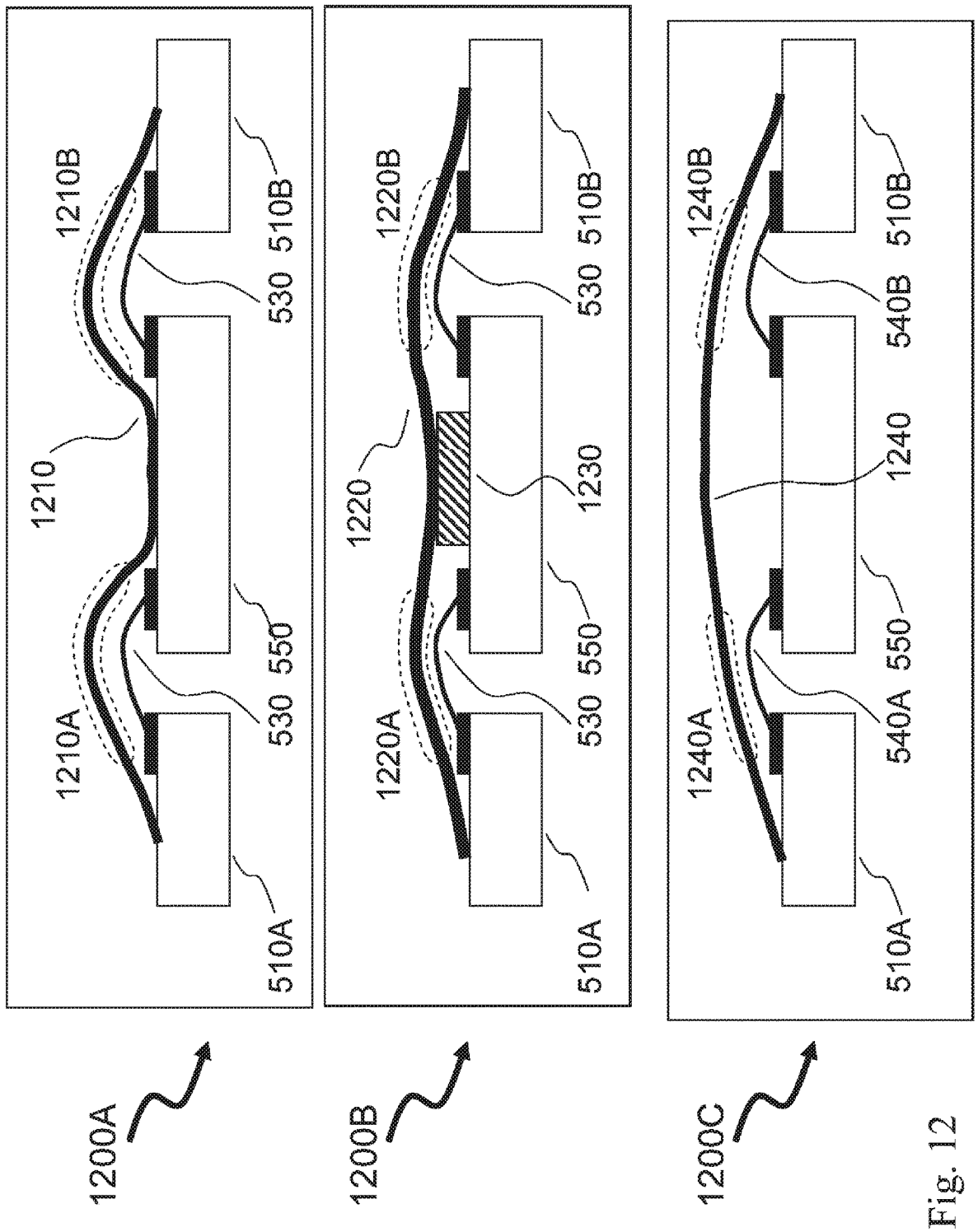
FIG. 12 illustrates three exemplary deployments of a meta-material overlay with respect to a semiconductor circuit within a package.

Throughout the exemplary embodiments supra the deployment scenarios for each of the meta-material overlays have been presented in respect of replacing wire bonds between the peripheries of first and second devices; including but not limited to semiconductor die, package, and printed circuit boards. Alternatively, the meta-material overlay is configured to provide an overlay to electrical interconnections disposed within the footprint of the package, semiconductor die, etc. Three such exemplary deployments of a meta-material overlay with respect to a semiconductor circuit within a package are shown in FIG. 12 by cross-sections 1200A through 1200C.

First cross-section 1200A depicts a scenario wherein a meta-material overlay 1210 lands directly onto the upper surface of a semiconductor die 550, originating on the left upper surface 510A of a circuit package, not shown for clarity, and terminating on the right upper surface of the circuit package 510B, As such the meta-material overlay 1210 forms two arcurate surfaces under which are bond wires 530. Each arcurate surface 1210A and 1210B is approximately parallel to its respective bond wire 530 for a substantial portion of the length of the bond wire 530. Whilst this exemplary cross-section 1200A depicts the meta-material overlay 1210 forming two arcurate surfaces, alternative embodiments may offer three or more such regions to provide the requisite impedance control for the bond wire interfaces either across a single die or an MCM. Further, the overlay is optionally shaped prior to deployment according to the requirements of the design or shaped during placement and bonding. Also, the meta-material overlay optionally is designed to not interconnect to the upper surface of the semiconductor die 550, but be spaced away with an air gap.

An alternative embodiment provides for the number of arcurate surfaces to vary according to position, such that for a portion of the interconnections there is a single arcurate surface whilst for other portions there are two, three or more arcurate surfaces. Also whilst the meta-material overlay 1210 is shown as a six-layer meta-material overlay, such as six-layer meta-material overlay 560, alternatives include but are not limited to the seven-layer and 13-layer meta-material overlays described supra such as the seven-layer meta-material overlay 910 and the 13-layer meta-material overlay 1100.

In second cross-section 1200B the meta-material overlay 1220 is again employed for impedance control of bond wires 530 between the upper surface of semiconductor die 550 and left and right upper surfaces 510A of a circuit package, not shown for clarity. The upper surface of semiconductor die 550 includes landing zone 1230, upon which the meta-material overlay 1220 is interconnected rather than interfacing directly to the upper surface of the semiconductor die 550. The landing zone 1230 vertically offsets the meta-material overlay 1220 over the semiconductor die 550, thereby modifying the shape of the arcurate surfaces 1220A and 1220B. Landing zone 1230 is formed according to standard semiconductor processes from a range of dielectric materials and metals, according to the requirements of the semiconductor die 550 and whether an electrical interconnection to the signal conductor plane of the meta-material overlay is made in the landing zone 1230. Typical materials for the landing zone 1230 include silicon dioxide, silicon nitride, silicon oxynitride, spin-on-glass, bisbenzocyclobutene, gold, and aluminum, each of these being optionally employed discretely or in combination.

Now referring to the third cross-section 1200C, the meta-material overlay 1240 again provides an overlay for the left wire bond 540A, originating on the left upper surface 510A of the circuit package, over semiconductor die 550, and for right wire bond 540B terminating on the right upper surface 510B of the circuit package. In contrast to first and second cross-sections 1200A and 1200B the meta-material overlay 1240 provides a single arcurate surface, wherein the left and right surface portions 1240A and 1240B are approximately parallel to wire bonds 540A and 540B for a predetermined region of each. Hence, whilst meta-material overlay 1240 typically does not provide as controlled an impedance environment for the wire bonds 540A and 540B when compared to the meta-material overlays 1220 and 1210 of first and second cross-sections 1200A and 1200B respectively, the formation of the structure in situ has reduced complexity. Accordingly the exemplary deployment embodiment in the third cross-section 1200C presents a different tradeoff between cost of implementation and performance to that of the first and second cross-sections 1200A and 1200B respectively.

Figure 13:
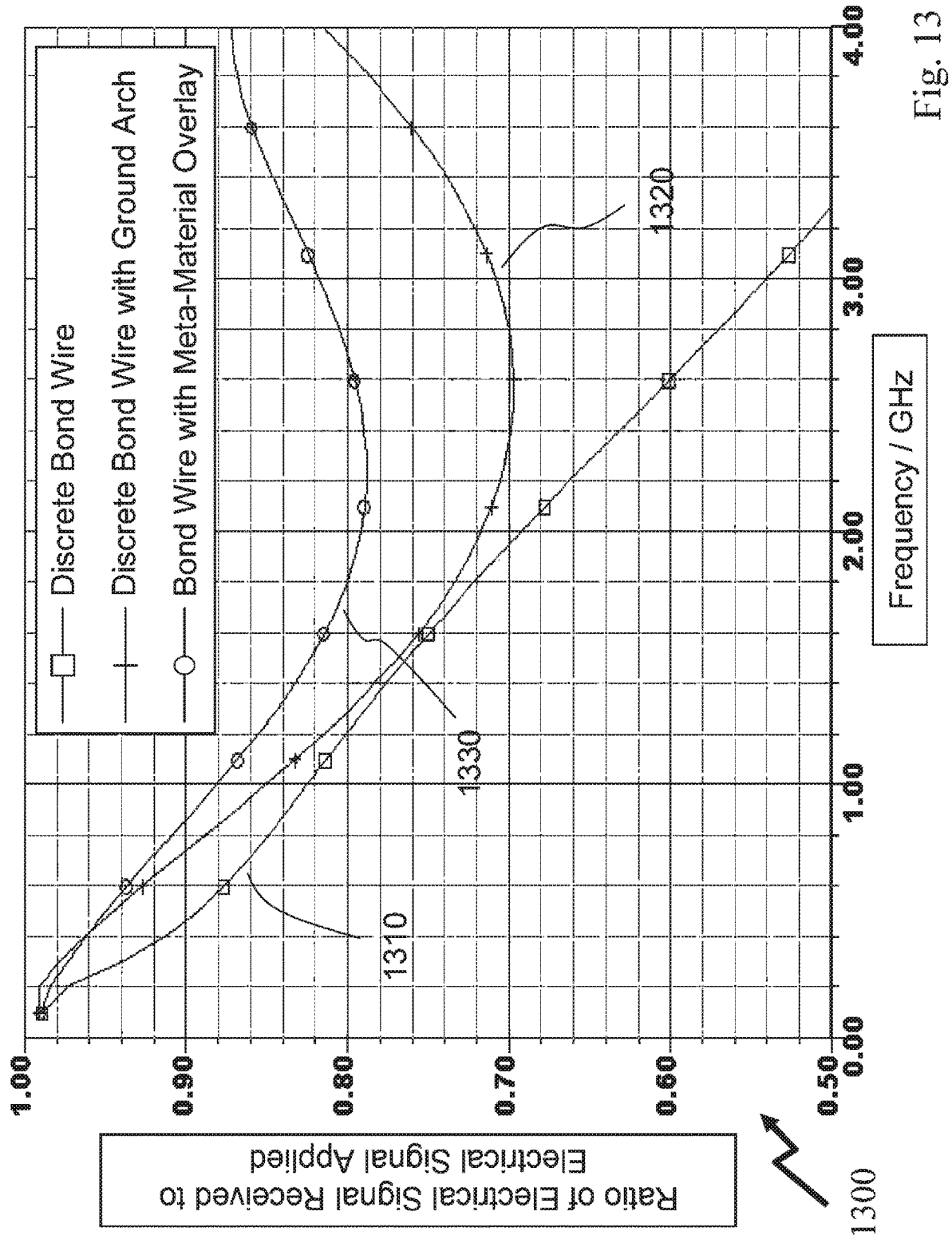
FIG. 13 illustrates the transmission characteristics of a bond wire with meta-material overlay according to an embodiment of the invention compared to prior art solutions.

Now referring to FIG. 13 there are shown simulation results 1300 for the transmission characteristics of electrical interconnections according prior art solutions and an embodiment of the invention, a bond wire with meta-material overlay. For each result the ratio of electrical signal received at the end of the electrical interconnection to electrical signal applied is shown as a function of frequency. A first curve 1310 plots this ratio for a single discrete bond wire, 14,500 μm long, according to the prior art, which essentially provides a linearly degrading transmission of the electrical interconnection with increasing frequency, having a 1dB loss for the 14,500 μm bond wire length at approximately 1.3 GHz, a 2 dB loss at approximately 2.4 GHz, and 3 dB loss at approximately 3.3 GHz.

Second curve 1320 plots the results for a single 14,500 μm bond wire length according to the prior art of Wyland [U.S. Pat. No. 7,217,997] wherein a ground arch is placed over the bond wire with air dielectric. In contrast to the single discrete bond wire, the second curve 1320 drops approximately linearly until 2 GHz and then flattens out to a maximum loss of approximately 1.6 dB at 2.6 GHz. Shown finally is third curve 1330, representing an exemplary electrical interconnection according to an embodiment of the invention wherein a meta-material overlay is employed in conjunction with the 14,500 μm bond wire. Now the loss increases approximately linearly to a maximum loss of approximately 1dB at 2.2 GHz whereupon it decreases to a loss of approximately 0.6 dB at 4 GHz.

The effectiveness of the exemplary embodiment against the prior art is clearly evident. For example at 3.3 GHz the third curve 1330 shows a loss of only 0.75 dB versus 3 dB for the discrete bond wire in first curve 1310, a 2.25 dB improvement; and an improvement of 0.6 dB from 1.55 dB to 0.95 dB when compared to second curve 1320 for the bond wire with an electrical ground plane.

Numerous other embodiments may be envisaged without departing from the spirit or scope of the invention.

The invention claimed is:

1. A method comprising:
   connecting a plurality of layers to a first device and a second device, wherein the plurality of layers includes:
     a first set of layers,
     a first conductor layer over the first set of layers, and
     a second set of layers over the first conductor layer, such that the first conductor layer is disposed between the first set of layers and the second set of layers, wherein the first conductor layer extends continuously along a width of the plurality of layers, wherein the first conductor layer has a first surface opposite a second surface, and further wherein:
       the first set of layers includes a second conductor layer and a third conductor layer, wherein the second conductor layer is disposed between the first surface of the first conductor layer and the third conductor layer;
       the second set of layers includes a fourth conductor layer and a fifth conductor layer, wherein the fourth conductor layer is disposed between the second surface of the first conductor layer and the fifth conductor layer;

the second conductor layer includes a first plurality of electrically independent conductors arranged to span the width of the plurality of layers and the third conductor layer extends continuously along the width of the plurality of layers; and the fourth conductor layer includes a second plurality of electrically independent conductors arranged to span the width of the plurality of layers and the fifth conductor layer extends continuously along the width of the plurality of layers.

2. The method of claim 1, wherein:
the first device includes a plurality of first bond pads and the second device includes a plurality of second bond pads; and
the first conductor layer physically contacts the plurality of first bond pads and the plurality of second bond pads.

3. The method of claim 1, wherein:
a wire bond physically contacts and electrically connects a first bond pad of the first device and a second bond pad of the second device; and
the plurality of layers overlies the wire bond, physically contacts the first device proximate the first bond pad, and physically contacts the second device proximate the second bond pad.

4. The method of claim 1, wherein:
the first device is a circuit package;
the second device is a die disposed within the circuit package;
a plurality of wire bonds physically contacts and electrically connects a plurality of first bond pads of the circuit package and a plurality of second bond pads of the die; and
the plurality of layers overlies the plurality of wire bonds and physically contacts the circuit package proximate the plurality of first bond pads of the circuit package.

5. The method of claim 4, wherein the plurality of layers does not physically contact the die.

6. The method of claim 5, wherein an air gap separates the plurality of layers from the die.

7. The method of claim 5, wherein the plurality of layers is separated from the die by a landing zone feature disposed on the die.

8. The method of claim 4, wherein the plurality of layers physically contacts the die.

9. The method of claim 4, wherein the plurality of layers has at least one arcuate surface that extends substantially parallel to the plurality of wire bonds.

10. The method of claim 1, wherein the first plurality of electrically independent conductors and the second plurality of electrically independent conductors each include concentrically-shaped metal features, wherein each of the concentrically-shaped metal features include a first set of two parallel lines and a second set of three parallel lines arranged perpendicular to the first set of two parallel lines, and wherein two lines of the second set of three parallel lines are aligned and physically separated from each other.

11. A method comprising:
connecting a thirteen-layer meta-material overlay to a first device and a second device, wherein the thirteen-layer meta-material overlay provides impedance control for an electrical interconnection between the first device and the second device and wherein the thirteen-layer meta-material overlay includes:

a first plurality of layers and a second plurality of layers, wherein the first plurality of layers and the second plurality of layers each include:
a first conductor layer;
a first insulator layer disposed over the first conductor layer;
a second conductor layer disposed over the first insulator layer, wherein the second conductor layer includes an array of linear-shaped conductors;
a second insulator layer disposed over the second conductor layer;
a third conductor layer disposed over the second insulator layer; wherein the third conductor layer includes an array of concentrically-shaped conductors; and
a third insulator layer disposed over the third conductor layer, and
a fourth conductor layer between the third insulator layer of the first plurality of layers and the third insulator layer of the second plurality of layers.

12. The method of claim 11, wherein the second conductor layer and the third conductor layer each include an insulating material and the array of linear-shaped conductors and the array of concentrically-shaped conductors are disposed in the insulating material.

13. The method of claim 11, wherein the connecting includes physically connecting the fourth conductor layer to at least one bonding area of the first device and at least one bonding area of the second device.

14. The method of claim 11, wherein each concentrically-shaped conductor of the array of concentrically-shaped conductors is rectangular-shaped.

15. A method comprising:
connecting a multi-layer meta-material overlay to a first device and a second device, wherein the multi-layer meta-material overlay provides impedance control for an electrical interconnection between the first device and a second device and the multi-layer meta-material overlay includes:
an electrical trace layer having a width that is about a width of the multi-layer meta-material overlay;
a first signal conductor plane and a second signal conductor plane, wherein the electrical trace layer is disposed between the first signal conductor plane and the second signal conductor plane, and further wherein the first signal conductor plane and the second signal conductor plane each have a width that is about the width of the multi-layer meta-material overlay; and
a first conductor layer and a second conductor layer, wherein the first conductor layer is disposed between the first signal conductor plane and the electrical trace layer and the second conductor layer is disposed between the second signal conductor plane and the electrical trace layer, wherein the first conductor layer and the second conductor layer each include an array of concentrically-shaped conductors, wherein a width of the array of concentrically-shaped conductors is about the width of the multi-layer meta-material overlay.

16. The method of claim 15, wherein the connecting includes physically connecting the electrical trace layer of the multi-layer meta-material overlay to at least one bonding area of the first device and at least one bonding area of the second device.

17. The method of claim 15, further comprising physically connecting the first signal conductor plane of the multi-layer meta-material overlay to ground.

18. The method of claim 15, further comprising physically connecting the second signal conductor plane of the multi-layer meta-material overlay to ground.

19. The method of claim 15, wherein the multi-layer meta-material overlay further includes a conductive feature that connects the electrical trace layer to the first signal conductor plane.

20. The method of claim 15, wherein the multi-layer meta-material overlay further includes a conductive feature that connects the electrical trace layer to the second signal conductor plane.

\* \* \* \* \*